United States Patent
Kang et al.

(10) Patent No.: US 11,527,498 B2
(45) Date of Patent: Dec. 13, 2022

(54) BUMP PAD STRUCTURE

(71) Applicant: QUALCOMM Incorporated, San Diego, CA (US)

(72) Inventors: Kuiwon Kang, San Diego, CA (US); Michelle Yejin Kim, San Diego, CA (US); Marcus Hsu, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 27 days.

(21) Appl. No.: 17/038,124

(22) Filed: Sep. 30, 2020

(65) Prior Publication Data

US 2022/0102298 A1    Mar. 31, 2022

(51) Int. Cl.
*H01L 23/00* (2006.01)

(52) U.S. Cl.
CPC .............. *H01L 24/05* (2013.01); *H01L 24/03* (2013.01); *H01L 2224/0401* (2013.01)

(58) Field of Classification Search
CPC .. H01L 24/05; H01L 24/03; H01L 2224/0401
See application file for complete search history.

(56) References Cited

U.S. PATENT DOCUMENTS

| 8,772,951 | B1* | 7/2014 | Kim | H05K 3/4682 257/774 |
| 2011/0284269 | A1* | 11/2011 | Maeda | H05K 3/4682 174/251 |
| 2015/0061143 | A1* | 3/2015 | Kim | H01L 23/528 257/773 |
| 2021/0287976 | A1* | 9/2021 | Buot | H01L 21/4857 |

* cited by examiner

*Primary Examiner* — Douglas W Owens
(74) *Attorney, Agent, or Firm* — Muncy, Geissler, Olds & Lowe, P.C.

(57) ABSTRACT

Aspects disclosed herein include a device including a bump pad structure and methods for fabricating the same. The device includes a bump pad. The device also includes a first trace adjacent the bump pad, where a first trace top surface is recessed a first recess distance from a bump pad top surface. The device also includes a second trace adjacent the first trace, covered at least in part by a solder resist. The device also includes a substrate, where the bump pad, the first trace, and the second trace are each formed on a portion of the substrate.

28 Claims, 11 Drawing Sheets

BUMP PAD STRUCTURE

FIELD OF DISCLOSURE

The field of the disclosed subject matter relates to generally to devices, such as semiconductor devices. In particular, the field of the disclosed subject matter relates to and more specifically, but not exclusively, to a device with a bump pad structure.

BACKGROUND

Integrated circuit technology has achieved great strides in advancing computing power through miniaturization of active components. Integrated passive components have also been miniaturized. Fifth generation (5G) cellular networks, commonly referred to as 5G, are expected to include frequencies in the range of up to 100 GHz to be used for mobile devices. As frequencies and data rates get higher, there is a need for further miniaturization of components and for higher density line and pin counts. Additionally, there has been a general trend of smaller form factors for mobile devices, such as, smartphones and tablets, laptops, notebooks, etc. To reduce the overall form factor, the thickness of the dies and package substrates should be as thin as possible. Recent advances in high-density and low-cost package substrates have been achieved through various fabrication technologies, such as embedded-trace-substrate (ETS), semi-additive process (SAP), modified semi-additive process (mSAP) and the like. However, as the line density and pin count have increased challenges have arisen such as solder joint reliability of the high density substrates.

Accordingly, there is a need for systems, apparatus, and methods that overcome the deficiencies of conventional approaches including the methods, system and apparatus provided herein.

SUMMARY

This summary identifies features of some example aspects, and is not an exclusive or exhaustive description of the disclosed subject matter. Whether features or aspects are included in, or omitted from this Summary is not intended as indicative of relative importance of such features. Additional features and aspects are described, and will become apparent to persons skilled in the art upon reading the following detailed description and viewing the drawings that form a part thereof.

In accordance with the various aspects disclosed herein, at least one aspect includes, a device, including a bump pad. The device also includes a first trace adjacent the bump pad, where a first trace top surface is recessed a first recess distance from a bump pad top surface. The device also includes a second trace adjacent the first trace, covered at least in part by a solder resist. The device also includes a substrate, where the bump pad, the first trace, and the second trace are each formed on a portion of the substrate.

In accordance with the various aspects disclosed herein, at least one aspect includes, a method of fabricating a device, including forming a bump pad. The fabricating also includes forming a first trace adjacent the bump pad, where a first trace top surface is recessed a first recess distance from a bump pad top surface. The fabricating also includes forming a second trace adjacent the first trace, covered at least in part by a solder resist. The fabricating also includes providing a substrate, where the bump pad, the first trace, and the second trace are each formed on a portion of the substrate.

Other features and advantages associated with the apparatuses and methods disclosed herein will be apparent to those skilled in the art based on the accompanying drawings and detailed description.

BRIEF DESCRIPTION OF THE DRAWINGS

The accompanying drawings are presented to aid in the description of examples of one or more aspects of the disclosed subject matter and are provided solely for illustration of the examples and not limitation thereof.

Figure 1:
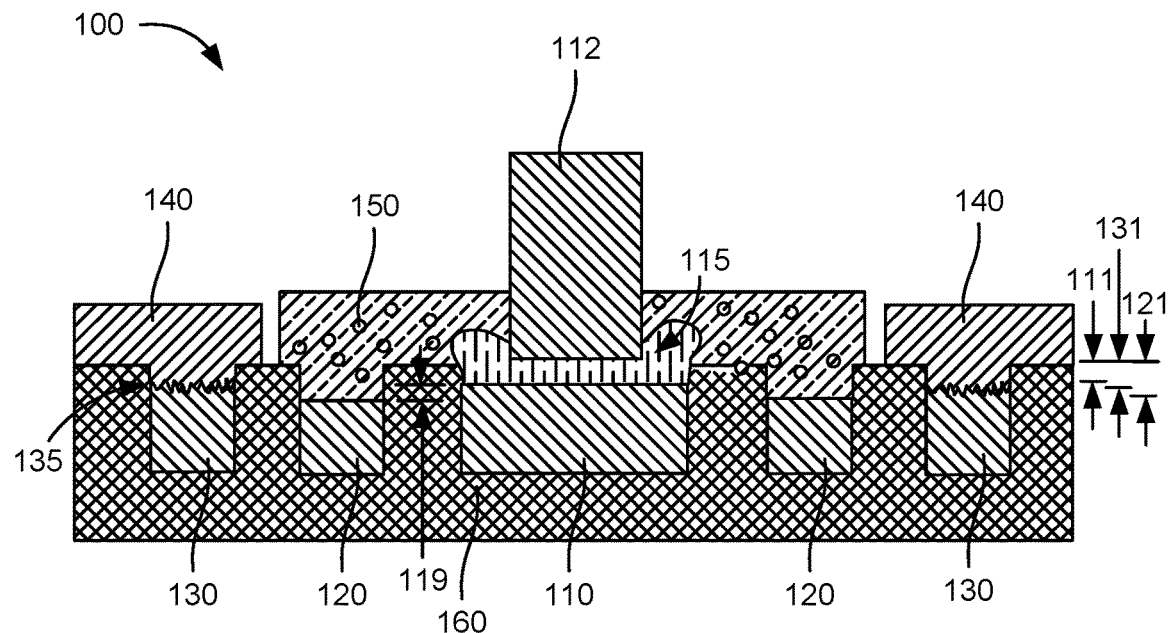
FIG. 1 illustrates a partial cross-sectional view of a bump pad structure for an embedded-trace-substrate (ETS) in accordance with at least one aspect of the disclosure.

In accordance with common practice, the features depicted by the drawings may not be drawn to scale. Accordingly, the dimensions of the depicted features may be arbitrarily expanded or reduced for clarity. In accordance with common practice, some of the drawings are simplified for clarity. Thus, the drawings may not depict all components of a particular apparatus or method. Further, like reference numerals denote like features throughout the specification and figures.

DETAILED DESCRIPTION

Aspects of the subject matter are provided in the following description and related drawings directed to specific examples of the disclosed subject matter. Alternative aspects may be devised without departing from the scope of the disclosed subject matter.

The word "exemplary" is used herein to mean "serving as an example, instance, or illustration." Any aspect described herein as "exemplary" is not necessarily to be construed as preferred or advantageous over other aspect. Likewise, the term "aspects" does not mean that all aspects of the disclosed subject matter include the discussed feature, advantage or mode of operation.

The terminology used herein is for the purpose of describing particular examples and is not intended to be limiting. As used herein, the singular forms "a", "an" and "the" are intended to include the plural forms as well, unless the context clearly indicates otherwise. It will be further understood that the terms "comprises", "comprising", "includes" and/or "including", when used herein, specify the presence of stated features, integers, processes, operations, elements, and/or components, but do not preclude the presence or addition of one or more other features, integers, processes, operations, elements, components, and/or groups thereof.

In a conventional processes including embedded-trace-substrate (ETS) circuit boards, non-conductive paste (NCP) filler entrapment is a problem at the ETS bump pads, which have a high profile surface. The roughing process used to allow for adhesion of a solder resist on traces in a region also roughens the surface of bump pads. The roughness of the bump pad causes an entrapment of the NCP filler in the rough surface. This entrapment, in some instances, results in portions of the bump pad, with the entrapped NCP filler, not having a good solder joint connection. Poor quality solder joints can result in poor performance and premature failure of the semiconductor devices.

FIG. 1 illustrates a partial cross-sectional view of a bump pad structure 100 for an embedded-trace-substrate (ETS) in accordance with at least one aspect of the disclosure. As illustrated, the ETS includes a bump pad 110. The bump pad 110 is coupled to a pillar 112 by a solder joint 115. The solder joint 115 is coated in a non-conductive paste (NCP) filler 150, as is the first trace 120, which is adjacent the bump pad 110. Adjacent the first trace 120 is a second trace 130 which is coated with a solder resist 140. As illustrated, the surface 135 of the second trace is roughened to allow for adhesion of the solder resist 140. In contrast to the conventional bump pad structures, the bump pad 110 has a smooth surface as does the first trace 120, which will be described in greater detail below in relation to the fabrication process. The bump pad structure 100 may also be considered to be a low profile bump pad structure. The bump pad 110, the first trace 120, and the second trace 130 are embedded in substrate 160. The bump pad 110, the pillar 112, the first trace 120 and the second trace 130 may be formed from any high conductive material, such as, copper (Cu), aluminum (AL), silver (Ag), gold (Au) or other conductive materials, alloys or combinations thereof. The substrate 160 may be formed of any suitable material, such as glass, epoxy, prepreg (bismaleimide triazine (BT) or epoxy resin based with glass composite), Ajinomoto build up films (ABF), resin-coated-copper (RCC) (resin based with ceramic filler composite) or other known materials. Further, it will be appreciated that in various aspects disclosed the substrate 160 can include any substrate configuration including one or more insulating and conductive layers, package substrates, printed circuit boards (PCBs) and the like.

As detailed below in Table 1, each of the bump pad 110, the first trace 120, and the second trace 130 are recessed a different depth from the surface of substrate 160. In some aspects a top surface of the first trace 120 is recessed from the top surface of the bump pad by a first recess distance 119. Alternatively, each of the bump pad 110, the first trace 120, and the second trace 130 may be viewed as having a different thickness. However, it will be appreciated that the thickness difference between the bump pad 110 and first trace 120 will result in the first recess distance 119. For example, bump pad 110 may have a pad recess depth 111 of about 2 um, with a variance of plus or minus 1 um, which results in a first recess depth in a range of about 1 um to 3 um. First trace 120 may have a first recess depth 121 of about 5 um, with a variance of plus or minus 2 um, which results in a first recess depth in a range of about 2 um to 7 um. Second trace 130 may have a second recess depth 131 of about 3 um, with a variance of plus or minus 1.5 um, which results in a second recess depth in a range of about 1.5 um to 4.5 um.

TABLE 1

|  | Pad 110 | Trace 120 | Trace 130 |
|---|---|---|---|
| Cu roughness (Ra) | Smooth (Max 200 nm) | Smooth (Max 200 nm) | Rough (Max 550 nm) |
| Recess depth | 2 um ± 1 um | 5 um ± 2 um | 3 um ± 1.5 um |
| Nominal Cu (for L/S 8 um/10 um) thickness target | 14 um | 10 um | 12 um |
| Nominal Cu (for L/S 6 um/8 um), thickness target | 10 um | 7 um | 8 um |

Further, as illustrated in Table 1, for a design with a line/space (L/S) pattern of 8 um/10 um, the nominal thickness of the bump pad 110 is 14 um, the first trace 120 is 10 um and the second trace 130 is 12 um. For a design with a line/space (L/S) pattern of 6 um/8 um, the nominal thickness or thickness of the bump pad 110 is 10 um, the first trace 120 is 7 um and the second trace 130 is 8 um. It will be appreciated that these nominal values are merely provided as examples and the various aspects disclosed herein are not limited to these specific example values. Additionally, as illustrated in Table 1, the surface roughness of the bump pad 110 and first trace 120 are generally smooth with a maximum roughness average (Ra) of 200 nm. The second trace 130 is not smoothed during processing (as discussed below) and accordingly has a generally rough surface with a maximum Ra of 550 nm. Further, as discussed above, the Ra in conventional devices would be similar across the bump pads, resulting in an increased risk of NCP filler entrapment and subsequent poor solder joint quality.

Figure 2A:
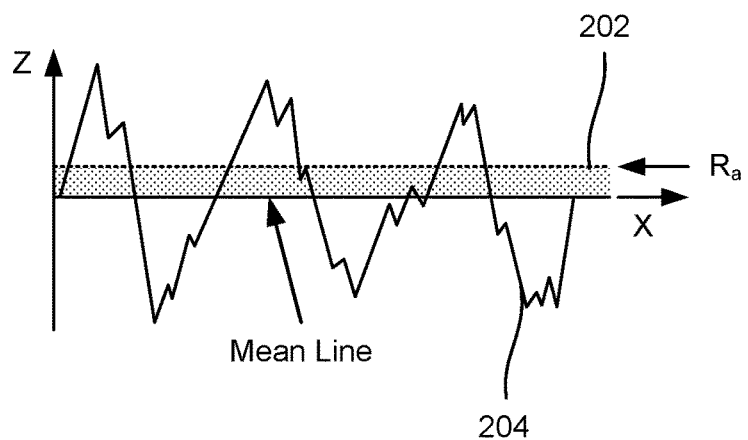
FIG. 2A illustrates an example of a surface roughness and a roughness average.

FIG. 2A illustrates an example of a roughness average (Ra) 202 for a general surface. For example, the Ra 202 for a general surface (e.g. bump pad surface) can be determined as, $Ra=1/1\int_0^1|Z(x)|dx$, where Z is the mean thickness of the surface and x is position across the surface. As illustrated, the mean line 204 varies in thickness in the Z direction and the Ra can be calculated as the absolute value of Z as function of x.

Figure 2B:
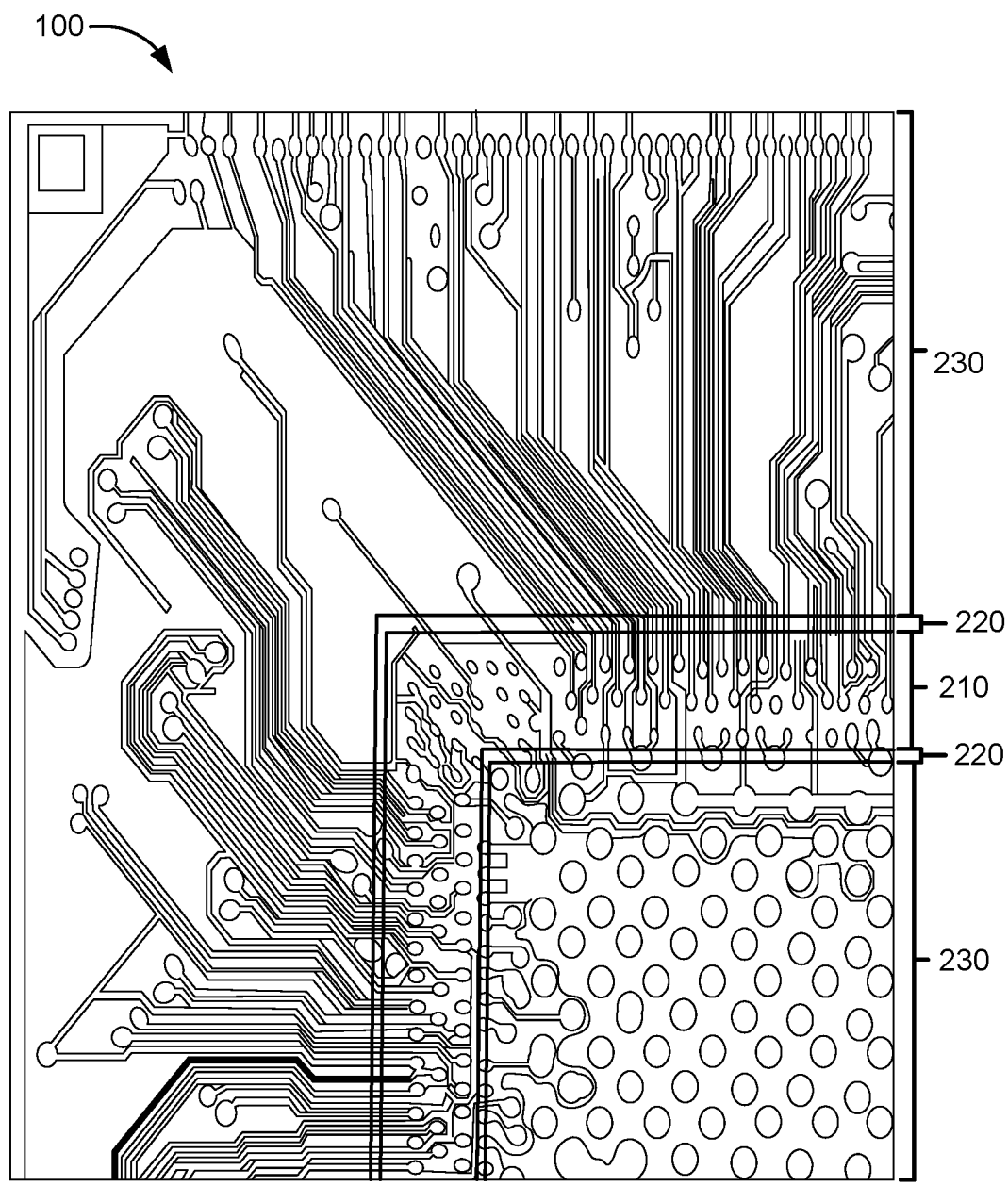
FIG. 2B illustrates a partial top view of an ETS in accordance with at least one aspect of the disclosure.

FIG. 2B illustrates a partial top view of an ETS with the bump pad structure 100 in accordance with at least one aspect of the disclosure. As illustrated in FIG. 2, the ETS may be divided into separate regions depending on the type of element located in each region. For example, bumping region 210 may be configured to contain bump pads (such as bump pad 110). An open region 220 is located on each side of the bumping region 210 and represents an area of exposed traces (such as first trace 120) due to the processing limitations during the bumping process. In some examples, the open region 220 may have a width in the range of 12.5 um to 25 um. The solder resist (SR) regions 230 is the solder resist trench area where the traces (such as second trace 130) are covered with solder resist (SR). The solder resist region 230 is located on either side of the open region opposite the bumping region 210

Figure 3A:
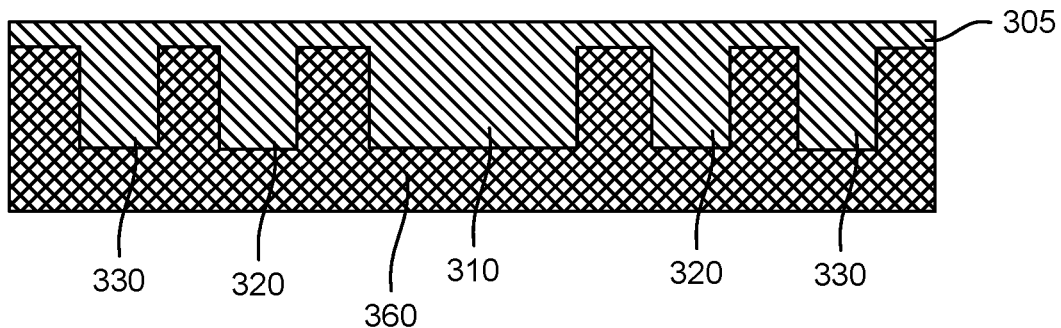
FIGS. 3A-3G illustrate different portions of a fabrication process in accordance with at least one aspect of the disclosure.

FIG. 3A illustrates a portion of a fabrication process in accordance with at least one aspect of the disclosure. As shown in FIG. 3A, the process can begin with a substrate 360 having a bump pad 310, first trace 320, which is adjacent the bump pad 310. Adjacent the first trace 320 is a second trace 330, which will be eventually covered by a solder resist. The bump pad 310, the first trace 320, and the second trace 330 may be formed on a seed layer 305 from a first metal (M1) layer deposition and patterning. Dielectric layer lamination may be used to form substrate 360. It will be appreciated that the ETS may have more than the one metal layer illustrated and may be formed from multiple metal and dielectric/insulator layers. The bump pad 310, traces 320 and the second trace 330 and seed layer 305 may be formed from any high conductive material, such as, copper (Cu), aluminum (AL), silver (Ag), gold (Au) or other conductive materials, alloys or combinations thereof. Further, it will be appreciated that in various aspects disclosed the substrate 360 can include any substrate configuration including one or more insulating and conductive layers, package substrates, printed circuit boards (PCBs) and the like.

Figure 3B:
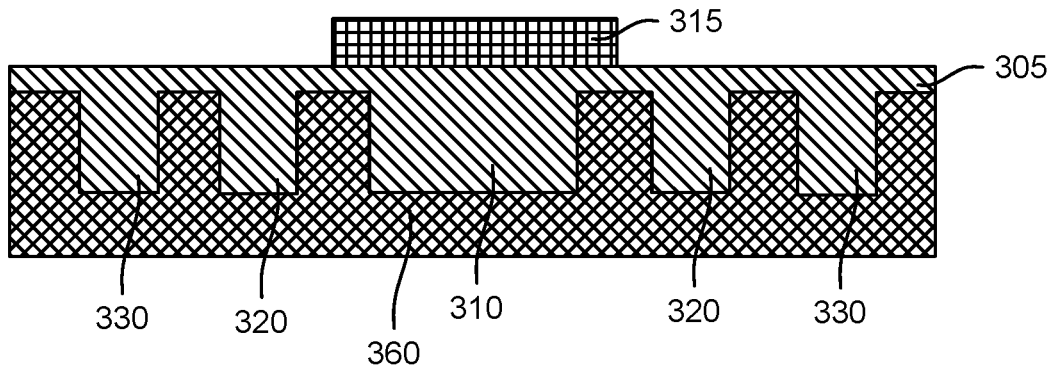

FIG. 3B illustrates a further portion of a fabrication process in accordance with some examples of the disclosure. As shown in FIG. 3B, the process can continue with the substrate 360 having a bump pad 310, first trace 320, second trace 330 and being covered on a top surface with the seed layer 305. In this portion of the process, a dry film resist (DFR) mask 315 is applied on the seed layer 305 over the bump pad 310. The DFR mask 315, in some aspects, extends beyond the bump pad 310. Alternatively, the DFR mask 315 may closely match the size of the bump pad 310. Additionally, it will be appreciated that the DFR mask does not extend over the first trace 320.

Figure 3C:
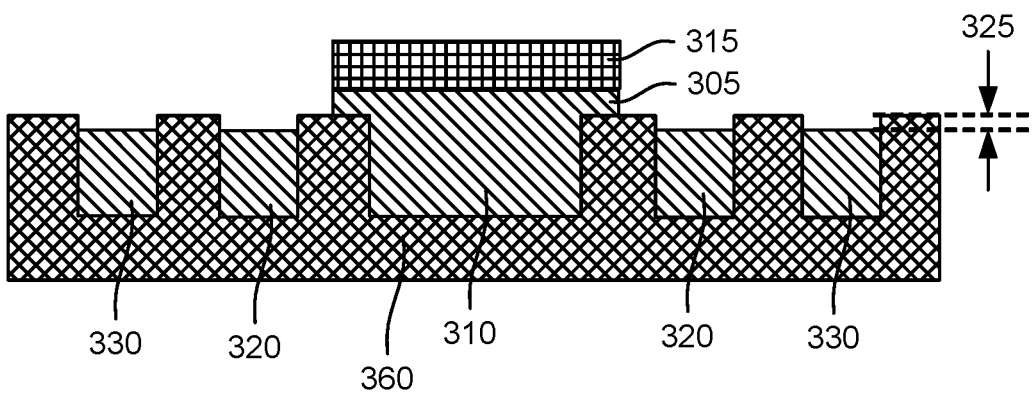

FIG. 3C illustrates a further portion of a fabrication process in accordance with some examples of the disclosure. As shown in FIG. 3C, the process can continue with the substrate 360 having a bump pad 310, first trace 320, and second trace 330. In this portion of the process, a dry film resist (DFR) mask 315 has protected the seed layer 305 over the bump pad 310 during an etching process, while the rest of the seed layer 305 was removed. Additionally, the etching process may result in a first trace 320 and second trace 330 to have material removed. Accordingly, the first trace 320 and second trace 330 are recessed by a recess depth 325 measured from the top surface of the substrate 360.

Figure 3D:
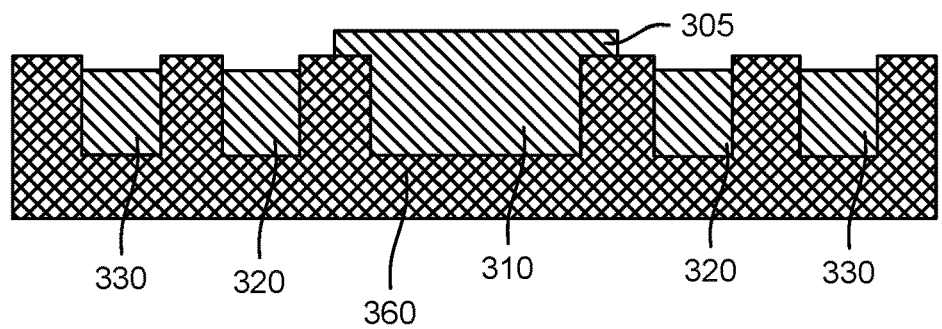

FIG. 3D illustrates a further portion of a fabrication process in accordance with some examples of the disclosure. As shown in FIG. 3D, the process can continue with the substrate 360 having a bump pad 310, first trace 320, and second trace 330. In this portion of the process, the DFR mask has been removed by stripping or any appropriate process. The removal of the DFR mask leaves the seed layer 305 over the bump pad 310.

Figure 3E:
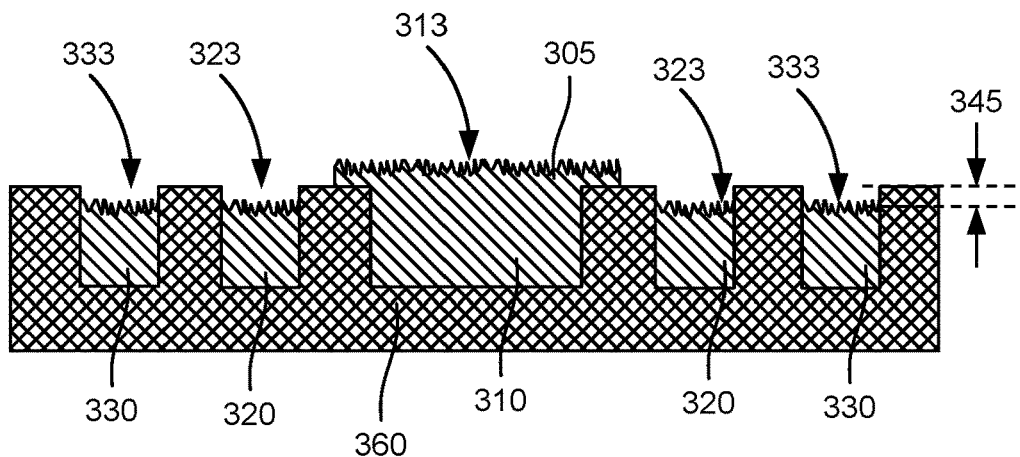

FIG. 3E illustrates a further portion of a fabrication process in accordance with some examples of the disclosure. As shown in FIG. 3E, the process can continue with the substrate 360 having a bump pad 310, first trace 320, and second trace 330. In this portion of the process, a photo solder resist (PSR) pretreatment is performed including a roughing process that roughens a seed layer top surface 313 over the bump pad 310 along with a first trace top surface 323 and a second trace top surface 333. The roughing process removes some material from the top surfaces of the seed layer 305, the first trace 320, and the second trace 330. Accordingly, the roughing process can cause the recess depth 345 to be increased for the first trace 320 and the second trace 330, where the recess depth 345 is measured from the top surface of the substrate 360.

Figure 3F:
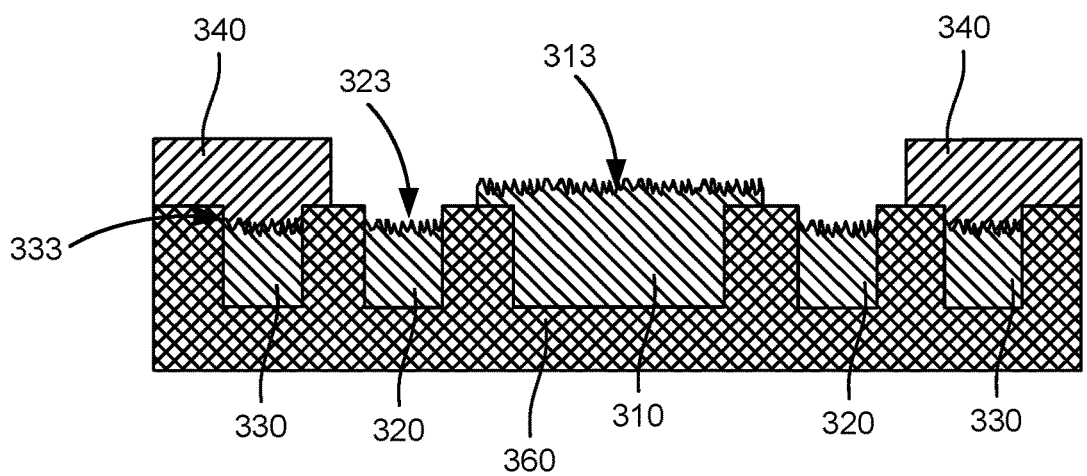

FIG. 3F illustrates a further portion of a fabrication process in accordance with some examples of the disclosure. As shown in FIG. 3F, the process can continue with the substrate 360 having a bump pad 310, first trace 320, and second trace 330. The seed layer top surface 313, the first trace top surface 323 and the second trace top surface 333 have been roughened. In this portion of the process, a PSR process is performed to deposit a solder resist 340 over the second trace 330. The roughened second trace top surface 333 aids in the adhesion of the solder resist 340.

Figure 3G:
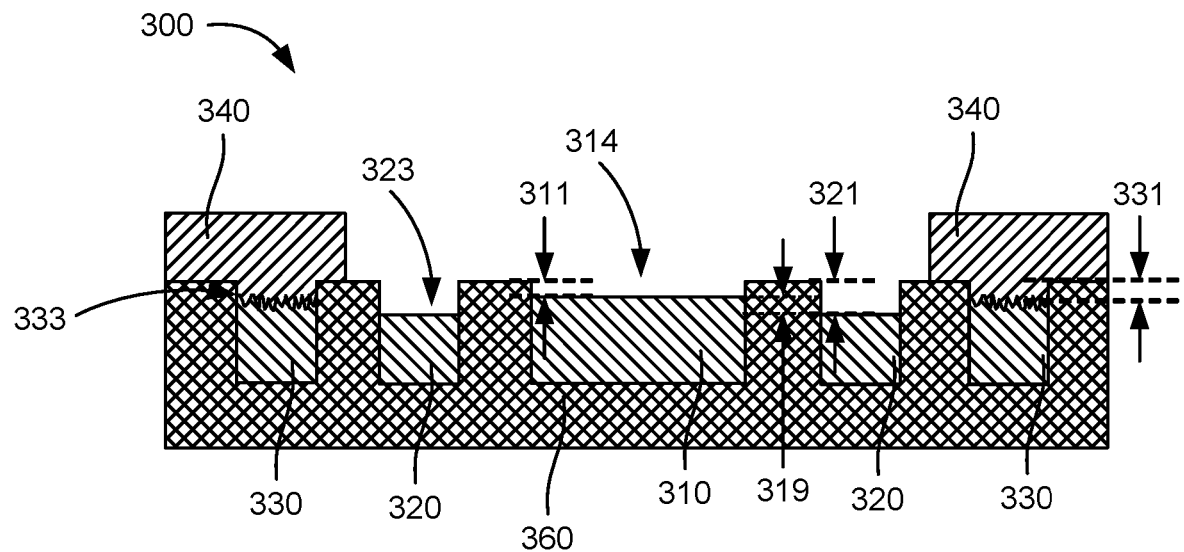

FIG. 3G illustrates a further portion of a fabrication process in accordance with some examples of the disclosure. As shown in FIG. 3G, the process can continue with the substrate 360 having a bump pad 310, first trace 320, and second trace 330. The second trace top surface 333 is covered by the solder resist 340. In this portion of the process, an additional (second) etching process is performed to remove the remaining seed layer. The additional etching process also reduces the roughness (smooths) a bump pad top surface 314 and the first trace top surface 323. Additionally, the additional etching process results in a recessing of the bump pad top surface 314 and a further recessing of the first trace top surface 323. The solder resist 340 over the second trace 330 protects the second trace 330 from further etching so it is unchanged. Accordingly, the bump pad recess depth 311 will be less than the second trace recess depth 331, which is less than the first trace recess depth 321. Further, the first trace top surface 323 of the first trace 320 is recessed a first recess distance 319 from a bump pad top surface 314. It will be appreciated that at this stage of the fabrication process, a bump pad structure 300 according to at least one aspect of the disclosure has been formed.

It will be appreciated that the aforementioned discussed aspects and illustrations in the associated figures are merely provided as examples to aid in the illustration of the various aspects disclosed. The various aspects claimed and disclosed are not limited to the specific references and/or illustrations in the associated figures.

Figure 4:
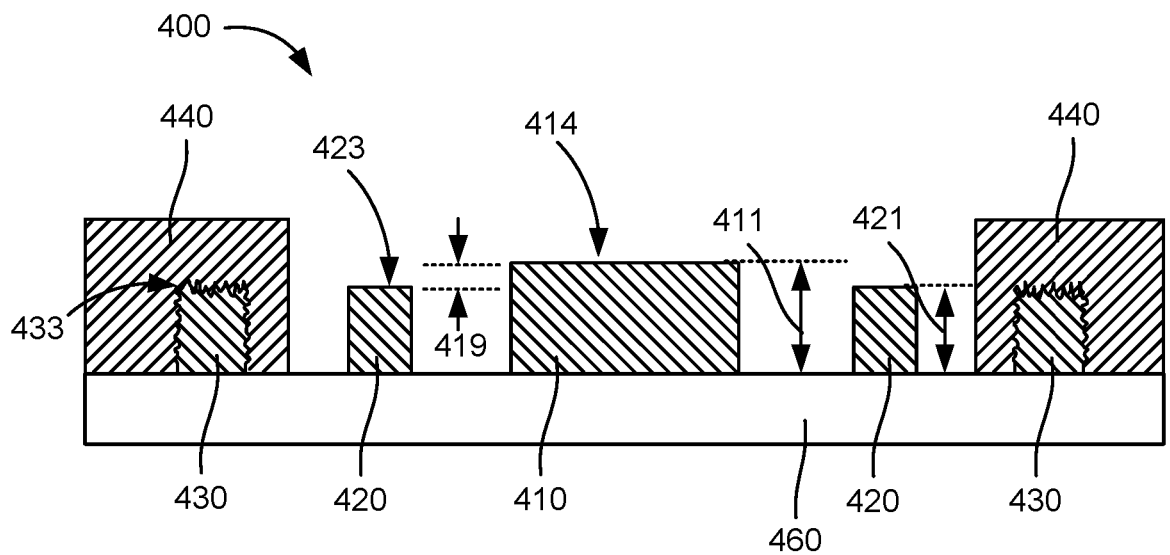
FIG. 4 illustrates a partial cross-sectional view of a bump pad structure in accordance with at least one aspect of the disclosure.

FIG. 4 illustrates a partial cross-sectional view of a bump pad structure 400 for a semi-additive process (SAP) or modified semi-additive process (mSAP) in accordance with at least one aspect of the disclosure. As illustrated, bump pad structure 400 includes a bump pad 410 and a first trace 420. It will be appreciated that the first trace 420 represents one or more first traces 420 located in an open region adjacent the bump pad 410. Adjacent the first trace 420 is a second trace 430 which is covered with a solder resist (SR) 440. It will be appreciated that the second trace 430 represents one or more second traces 430 located in an SR region adjacent the open region containing the first trace 420. As illustrated, the surface 433 of the second trace is roughened to allow for adhesion of the SR 440. The bump pad 410, the first trace 420, and the second trace 430 are formed on a substrate 460. It will be appreciated that because of the additive fabrication process, the second trace is not embedded in a substrate and any exposed surface will be roughened, not just the top surface. In contrast to the conventional bump pad structures with roughened surfaces on all traces and bump pads, the bump pad 410 has a smooth surface as does the first trace 420, which will be described in greater detail below in relation to the fabrication process. Since the bump pad 410, the first trace 420 and the second trace 430 are formed from an additive process, there can be a difference in the thickness, as illustrated. For example, the bump pad thickness 411 generally may be greater than the first trace thickness 421. The first trace top surface 423 of the first trace 420 is recessed a first recess distance 419 from a bump pad top surface 414. The bump pad 410, the first trace 420 and the second trace 430 may be formed from any high conductive material, such as, copper (Cu), aluminum (AL), silver (Ag), gold (Au) or other conductive materials, alloys or combinations thereof. The substrate 460 may be formed of any suitable material, such as glass, epoxy, prepreg (bismaleimide triazine (BT) or epoxy resin based with glass composite), Ajinomoto build up films (ABF), resin-coated-copper (RCC) (resin based with ceramic filler composite) or other known materials. Further, it will be appreciated that in various aspects disclosed the substrate 460 can include any substrate configuration including one or more insulating and conductive layers, package substrates, printed circuit boards (PCBs) and the like.

As detailed below in Table 2, each of bump pad 410, the first trace 420 and the second trace 430 may have a different thickness from the surface of substrate 460. As illustrated in Table 2, for a design with a line/space (L/S) pattern of 8 um/8 um, the nominal thickness of the bump pad 410 is 12 um, the first trace 420 is 9 um and the second trace 430 is 10 um. For a design with a line/space (L/S) pattern of 5 um/5 um, the nominal thickness of the bump pad 410 is 9 um, the first trace 420 is 6 um and the second trace 430 is 7 um. It will be appreciated that these nominal values are merely provided as examples and the various aspects disclosed herein are not limited to these specific example values. Additionally, as illustrated in Table 2, the surface roughness of the bump pad 410 and first trace 420 are generally smooth with a maximum roughness average (Ra) of 200 nm. The second trace 430 is not smoothed during processing (as discussed below) and accordingly has a generally rough surface with a maximum Ra of 550 nm.

TABLE 2

|  | Pad 410 | Trace 420 | Trace 430 |
| --- | --- | --- | --- |
| Cu roughness (Ra) | Smooth (Max 200 nm) | Smooth (Max 200 nm) | Rough (Max 550 nm) |
| Nominal Cu (if L/S 8 um/8 um) thickness target | 12 um | 9 um | 10 um |
| Nominal Cu (if L/S 5 um/5 um) thickness target | 9 um | 6 um | 7 um |

Figure 5A:
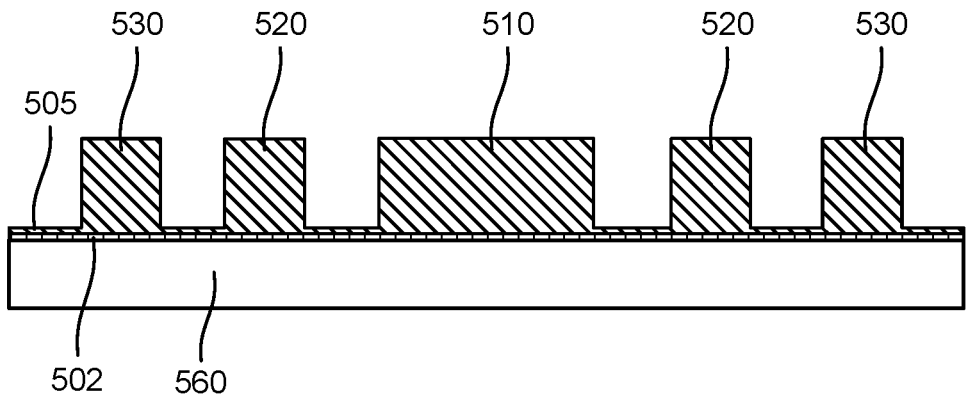
FIGS. 5A-5G illustrate different portions of a fabrication process in accordance with at least one aspect of the disclosure.

FIG. 5A illustrates a portion of a fabrication process in accordance with some examples of the disclosure. As shown in FIG. 5A, the process can begin with a substrate 360 having a bump pad 510, first trace 520, which is adjacent the bump pad 510. Adjacent the first trace 520, which is in an open region, is a second trace 530, which will be eventually covered by a solder resist. The bump pad 510, the first trace 520, and the second trace 530 may be formed on a seed layer 505 from using additive deposition and patterning. A primer layer 502 may also be provided and disposed between the substrate 560 and the seed layer 505. The bump pad 510, first trace 520, second trace 530 and seed layer 505 may be formed from any high conductive material, such as, copper (Cu), aluminum (AL), silver (Ag), gold (Au) or other conductive materials, alloys or combinations thereof. In some aspects the seed layer may be a formed by an electroless plating processes (e.g., e'less Cu). Further, it will be appreciated that in various aspects disclosed the substrate 560 can include any substrate configuration including one or more insulating and conductive layers, package substrates, printed circuit boards (PCBs) and the like.

Figure 5B:
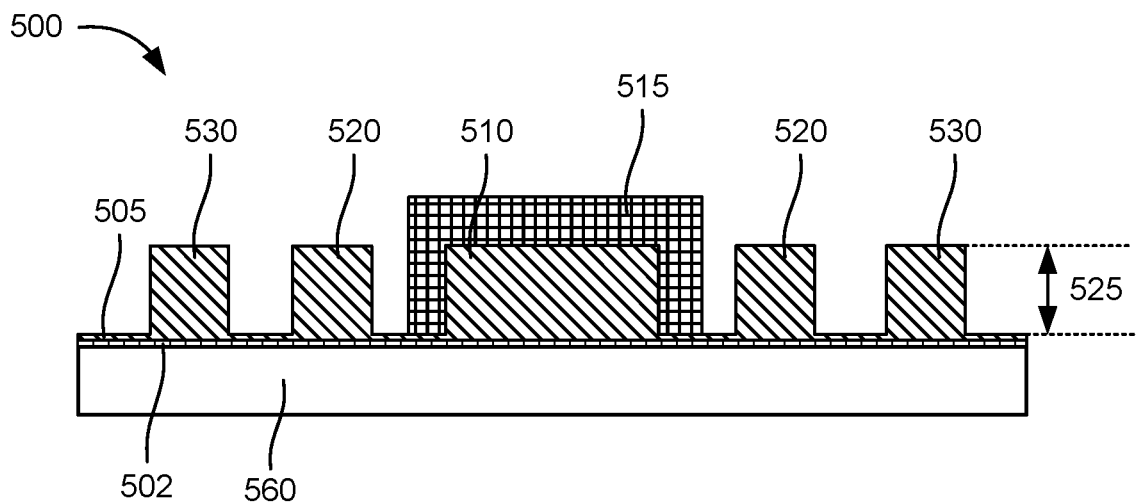

FIG. 5B illustrates a further portion of a fabrication process in accordance with some examples of the disclosure. As shown in FIG. 5B, the process can continue with the substrate 560 being covered with the seed layer 505 and primer layer 502. The bump pad 510, first trace 520, second trace 530 are formed on the seed layer 505. The bump pad 510, first trace 520 and second trace 530 are substantially the same thickness 525. In this portion of the process, a dry film resist (DFR) mask 515 is applied on the bump pad 510. The DFR mask 515, in some aspects, may completely cover the bump pad 510. Alternatively, the DFR mask 515 may cover at least the top surface of bump pad 510. Additionally, it will be appreciated that the DFR mask 515 does not extend over the first trace 520.

Figure 5C:
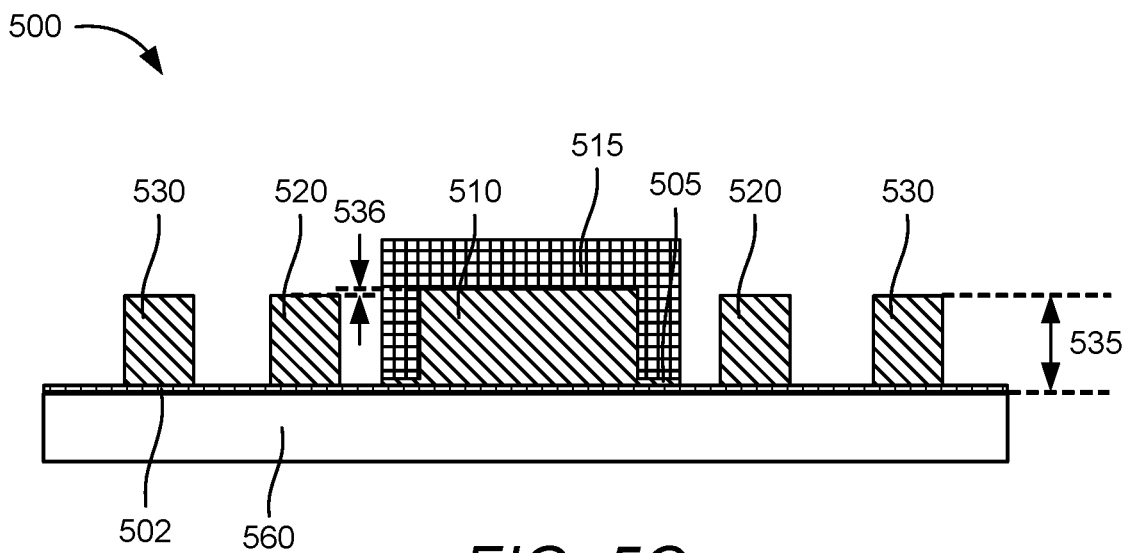

FIG. 5C illustrates a further portion of a fabrication process in accordance with some examples of the disclosure. As shown in FIG. 5C, the process can continue with the bump pad 510 covered with the DFR mask 515. The first trace 520 and second trace 530 are being formed on the seed layer 505 on the primer layer 502. In this portion of the process, the DFR mask 515 has protected a portion of seed layer 505 and the bump pad 510 during a first etching process. The exposed seed layer 505 was removed. The portions of the seed layer 505 under the first trace 520 and second trace 530 were also protected and remain after the first etching process. The first trace 520 and second trace 530 are substantially the same thickness 535 from the surface of substrate 560. However, the first trace 520 and second trace 530 have been reduced in thickness by the first etching process Accordingly, the first trace 520 and second trace 530 are recessed by a recess depth 536 measured from the top surface of the bump pad 510.

Figure 5D:
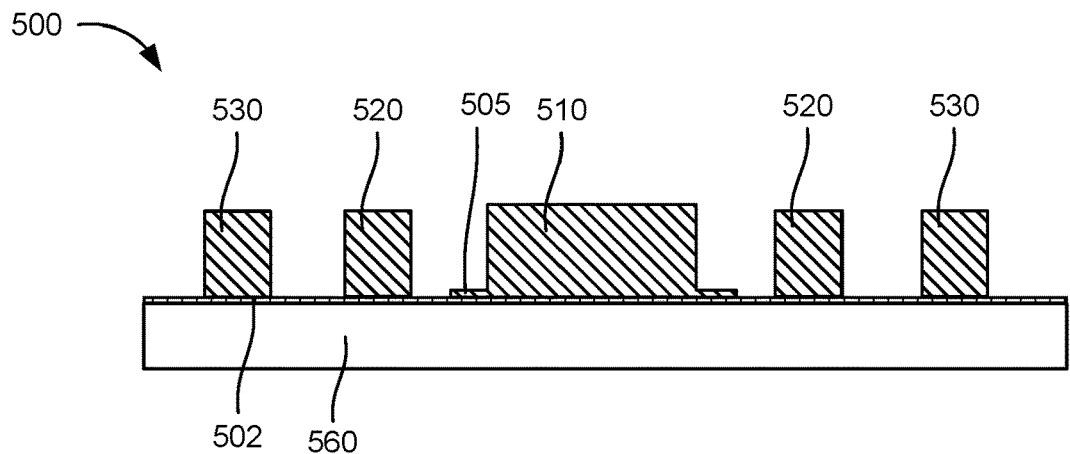

FIG. 5D illustrates a further portion of a fabrication process in accordance with some examples of the disclosure. As shown in FIG. 5D, the process can continue with the substrate 560 having bump pad 510, first trace 520, second trace 530 formed on the seed layer 505 disposed on primer layer 502. In this portion of the process, the DFR mask 515 (not illustrated) has been removed by stripping or any appropriate process. The removal of the DFR mask 515 results in the seed layer 505 adjacent the bump pad 510 being exposed.

Figure 5E:
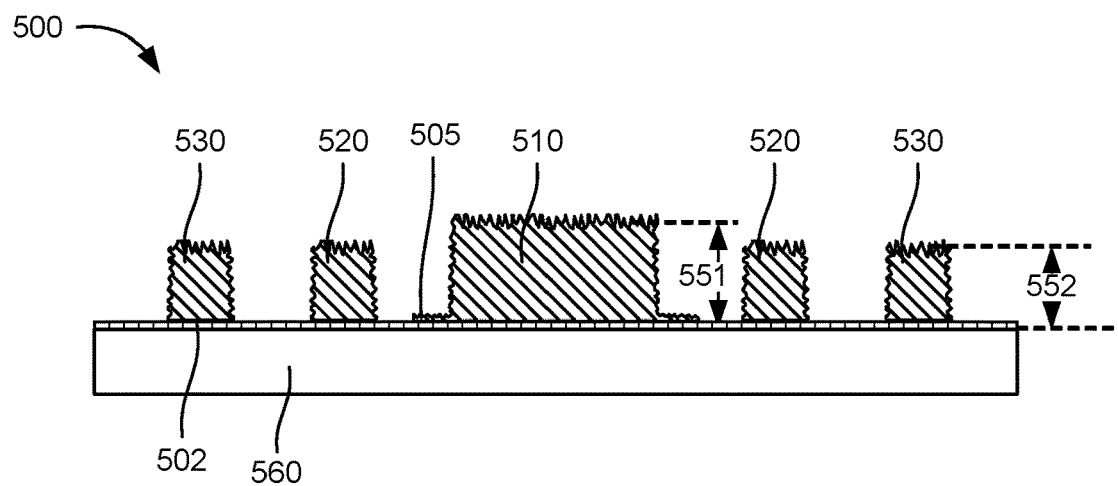

FIG. 5E illustrates a further portion of the fabrication process in accordance with some examples of the disclosure. As shown in FIG. 5E, the process can continue with the substrate 560 having bump pad 510, first trace 520, second trace 530 formed on the seed layer 505 disposed on primer layer 502. Portions of seed layer 505 adjacent the bump pad 510 are exposed. In this portion of the process, a photo solder resist (PSR) pretreatment is performed including a roughing process that roughens the top surfaces and other exposed metal surfaces of the bump pad 510, the first trace 520 and the second trace 530. The roughing process removes some material from the top surfaces of the bump pad 510, the first trace 520, and the second trace 530. Accordingly, the roughing process can reduce a thickness 551 of the bump pad 510 and also a thickness 552 of the first trace 320 and the second trace 330. The thickness 551 and thickness 552 are measured from the surface of the substrate in this example.

Figure 5F:
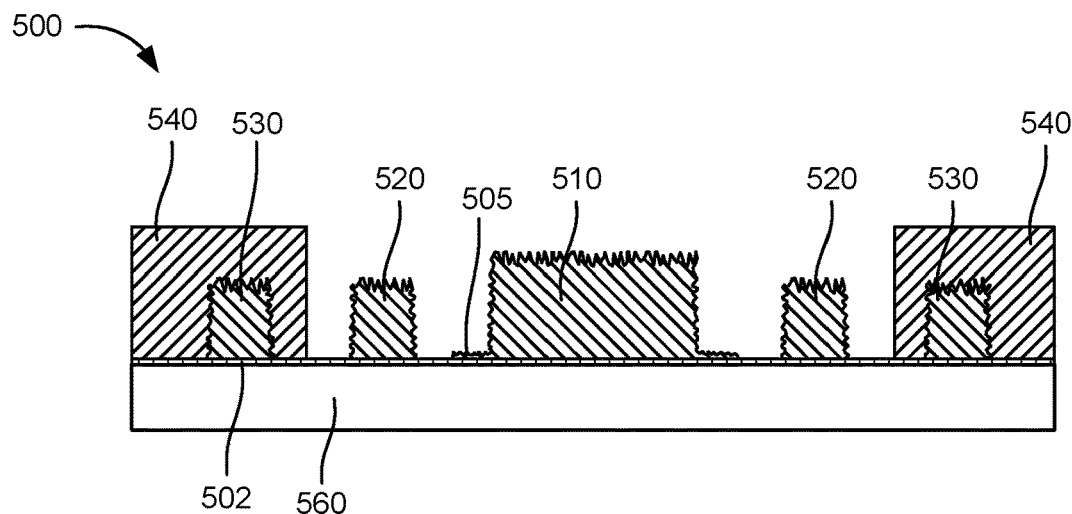

FIG. 5F illustrates a further portion of a fabrication process in accordance with some examples of the disclosure. As shown in FIG. 5F, the process can continue with the substrate 560 having bump pad 510, first trace 520, second trace 530 formed on the seed layer 505 disposed on primer layer 502. Portions of seed layer 505 adjacent the bump pad 510 are exposed. The exposed surfaces of the bump pad 510, the first trace 520, the second trace 530 and the seed layer 505 have been roughened. In this portion of the process, a PSR process is performed to deposit a solder resist 540 over the second trace 530. The roughened surfaces of the second trace 530 aids in the adhesion of the solder resist 540.

Figure 5G:
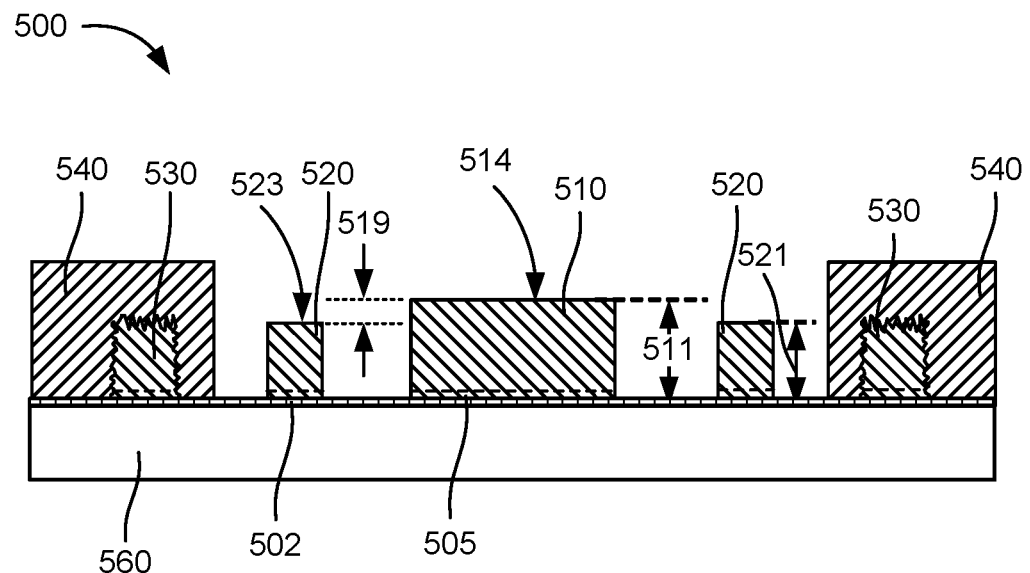

FIG. 5G illustrates a further portion of a fabrication process in accordance with some examples of the disclosure.

As shown in FIG. 5F, the process can continue with the substrate 560 having bump pad 510, first trace 520 and second trace 530 formed on the seed layer 505 disposed on primer layer 502. The second trace 530 is covered by the solder resist 540. In this portion of the process, an additional etching process is performed to remove the portions of seed layer 505 adjacent the bump pad 510. The additional etch process also reduces the roughness (smooths) the exposed surfaces of the bump 510 and the first trace 520. Further, the additional etching process results in a recessing of the bump pad 510 and the first trace 520. The solder resist 540 covering the second trace 530 protects the second trace 530 from further etching so it is unchanged. Accordingly, the bump pad 510 will have a bump pad thickness 511 which is greater than the first trace thickness 521 of the first trace 520. The first trace top surface 523 of the first trace 520 is recessed a first recess distance 519 from a bump pad top surface 514. It will be appreciated that at this stage of the fabrication process, a bump pad structure 500 according to at least one aspect of the disclosure has been formed. Further, it will be appreciated that although the seed layer 505 is illustrated (in dashed lines), the seed layer 505 may be considered to be integrated into the respective portions of the bump pad 510, first trace 520, and second trace 530 that were formed on the seed layer 505.

Referring back to FIG. 4, it will be appreciated that the bump pad structure 400 is similar to the bump pad structure 500, in FIG. 5G, but does not have the primer layer. The fabrication process can be similar, however, the primer layer will not be part of the original or final structure. Accordingly, a detailed repetition of the fabrication process will not be provided. The bump pad structure 400 may include a substrate 460 having bump pad 410, first trace 420 and second trace 430 formed on a seed layer (not expressly illustrated). In some aspects the seed layer may be a formed by an electroless plating processes (e.g., e'less Cu). Also, as noted above, after forming the bump pad structure 400, the seed layer can be considered to be part of the bump pad 410, first trace 420, and second trace 430. It will be appreciated that the bump pad thickness 411 and the first trace thickness 421 may be different then the foregoing example in FIG. 5G because of the addition of the primer layer. However, the thickness could also be the same, depending on the original thickness and subsequent etching reduction. Accordingly, the various illustrated examples should not be construed to limit the various aspects disclosed or claimed herein.

Figure 6:
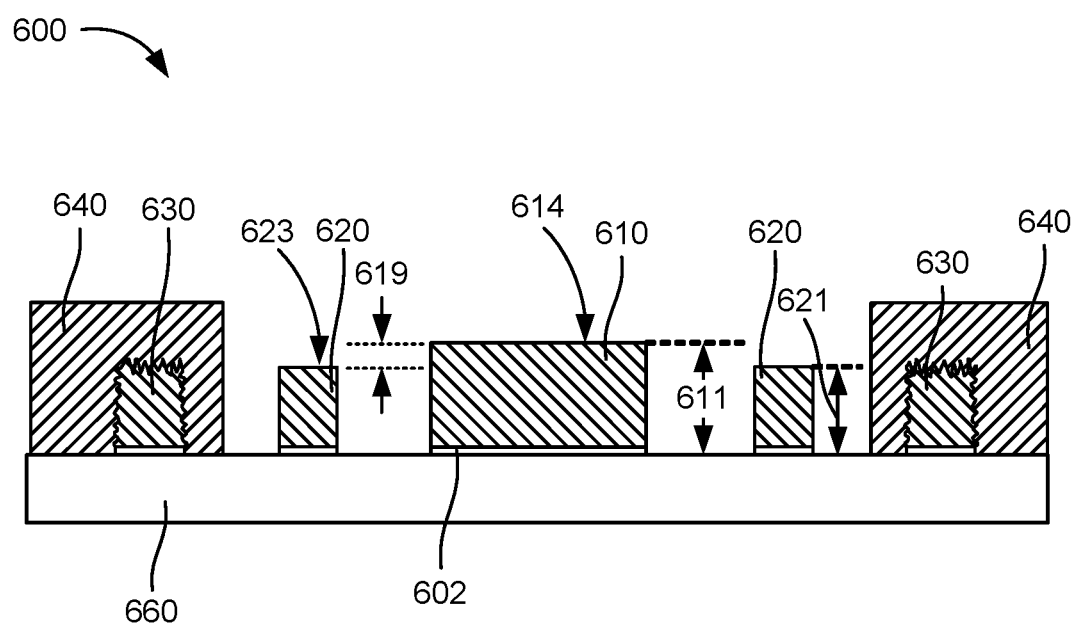
FIG. 6 illustrates a partial side view of a bump pad structure in accordance with at least one aspect of the disclosure.

FIG. 6 illustrates a bump pad structure 600 according to at least one aspect of the disclosure. As shown in FIG. 6, the bump pad structure 600 is similar to the bump pad structure 500, in FIG. 5G. The bump pad structure 600 includes a base metal layer 602 and does not have the primer layer. Accordingly, the fabrication process can be similar to that described above, with the base metal layer 602 being be part of the original and final structure. The bump pad structure 600 includes a substrate 660 having bump pad 610, first trace 620 and second trace 630 formed on a seed layer (not explicitly illustrated) formed on a base metal layer 602 (such as a copper foil). The roughened exposed surfaces of the bump 610 and the first trace 620 have been smoothed by a second etching process, as discussed above. The second etching process results in the bump pad 610 with a bump pad thickness 611 which is greater than the first trace thickness 621 of the first trace 620. The first trace top surface 623 of the first trace 620 is recessed a first recess distance 619 from a bump pad top surface 614. It will be appreciated that the bump pad thickness 611 and the first trace thickness 621 may be different then the foregoing examples in FIG. 5G because there is the base metal layer 602 in addition to the seed layer. Alternatively, the thickness could also be the same, depending on the original thickness and subsequent etching reduction, which may be determined in the design process. Accordingly, the various illustrated examples should not be construed to limit the various aspects disclosed or claimed herein.

Figure 7:
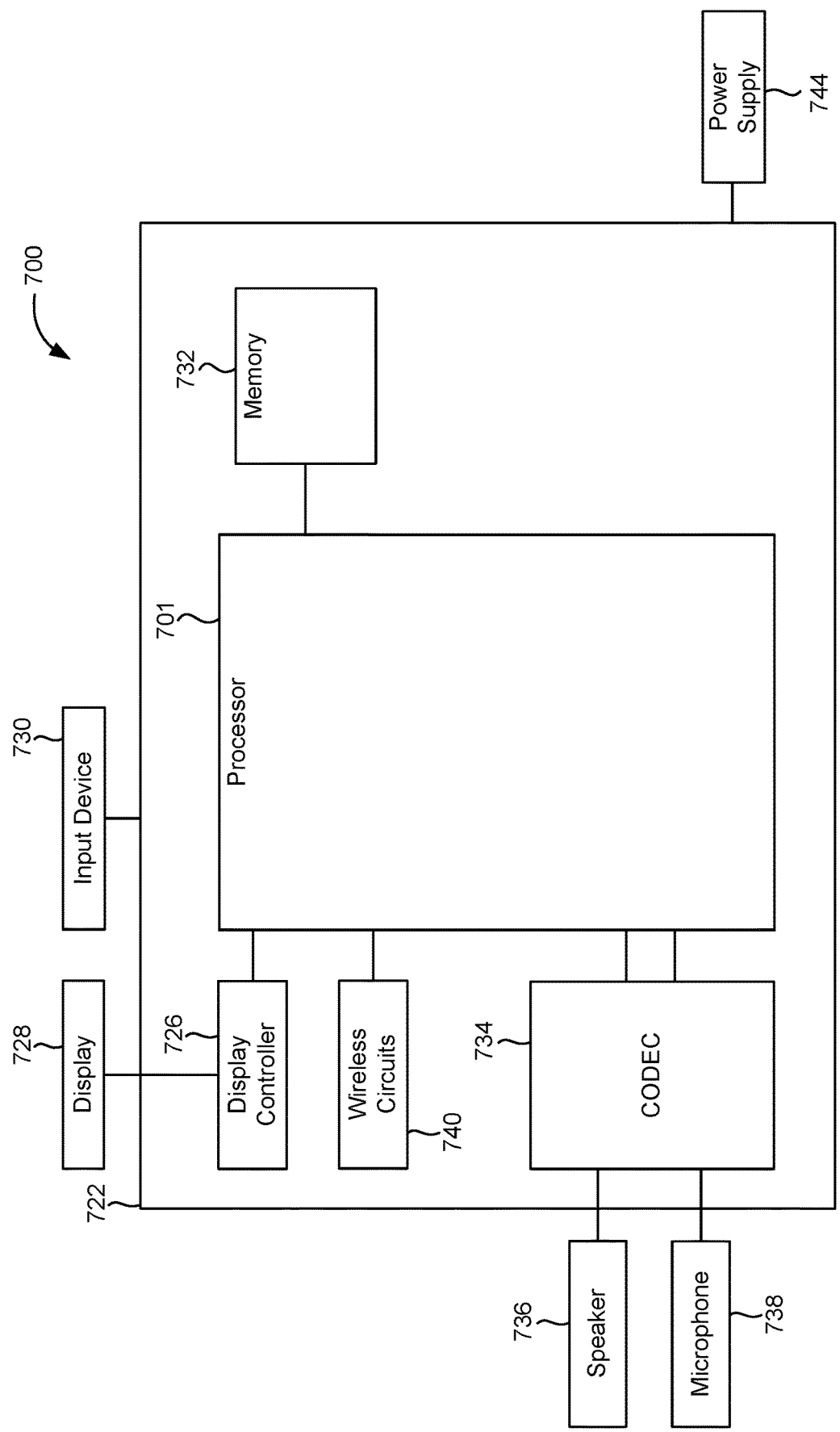
FIG. 7 illustrates a mobile device in accordance with at least one aspect of the disclosure.

FIG. 7 illustrates a mobile device in accordance with some examples of the disclosure. Referring now to FIG. 7, a block diagram of a mobile device that is configured according to exemplary aspects is depicted and generally designated mobile device 700. In some aspects, mobile device 700 may be configured as a wireless communication device. As shown, mobile device 700 includes processor 701. Processor 701 may be communicatively coupled to memory 732 over a link, which may be a die-to-die or chip-to-chip link. Mobile device 700 also includes display 728 and display controller 726, with display controller 726 coupled to processor 701 and to display 728.

In some aspects, FIG. 7 may include coder/decoder (CODEC) 734 (e.g., an audio and/or voice CODEC) coupled to processor 701; speaker 736 and microphone 738 coupled to CODEC 734; and wireless circuitry 740 (which may include a modem, radio frequency (RF) circuitry, filters, and one or more antennas) coupled to processor 701. The various electronic devices such as wireless circuitry 740, processor 701, memory 732 or any other device that includes semiconductor dies and packages with bump pad connections may include the bump pad structures disclosed herein.

In a particular aspect, where one or more of the above-mentioned blocks are present, processor 701, display controller 726, memory 732, CODEC 734, and wireless circuits 740 can be included in a system-in-package or system-on-chip device 722. Input device 730 (e.g., physical or virtual keyboard), power supply 744 (e.g., battery), display 728, input device 730, speaker 736, microphone 738, wireless antenna 742, and power supply 744 may be external to system-on-chip device 722 and may be coupled to a component of system-on-chip device 722, such as an interface or a controller.

It should be noted that although FIG. 7 depicts a mobile device, processor 701 and memory 732 may also be integrated into a set top box, a music player, a video player, an entertainment unit, a navigation device, a personal digital assistant (PDA), a fixed location data unit, a computer, a laptop, a tablet, a communications device, a mobile phone, an Internet of things (IoT) device, a wireless device in a vehicle, or other similar devices.

Figure 8:
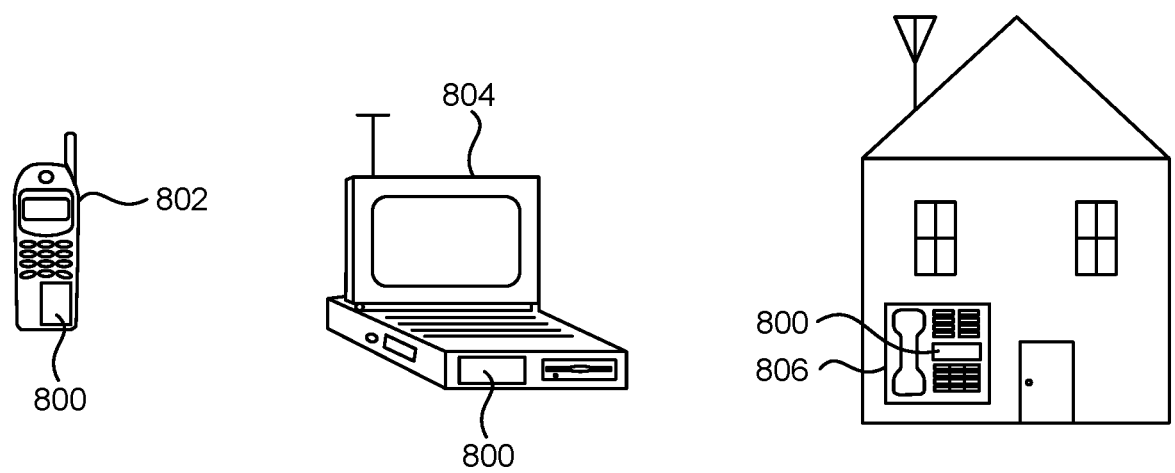
FIG. 8 illustrates various electronic devices that may be integrated with any of the foregoing devices in accordance with at least one aspect of the disclosure.

FIG. 8 illustrates various apparatuses that include components having bump pad structures, in accordance with various aspects of the disclosure. For example, a mobile phone device 802, a laptop computer device 804, and a fixed location terminal device 806 may each be consider generally user equipment (UE) and may include a device 800 including the bump pad structures in accordance with the various aspects disclosed herein. The device 800, for example, may be included in any of the devices described herein. The apparatuses 802, 804, 806 illustrated in FIG. 8 are merely provided as examples. Other devices may also feature the device 800 including, but not limited to, a group of apparatuses (e.g., electronic devices) that includes mobile devices, hand-held personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices, servers, routers, electronic devices implemented in automotive vehicles (e.g., autonomous vehicles), an Internet of things (IoT) device or any other device that has wireless communication capabilities or any combination thereof.

The foregoing disclosed devices and functionalities may be designed and configured into computer files (e.g., register-transfer level (RTL), Geometric Data Stream (GDS) Gerber, and the like) stored on computer-readable media. Some or all such files may be provided to fabrication handlers who fabricate devices based on such files. Resulting products may include semiconductor wafers that are then cut into semiconductor die and packaged using the bump pad structures in accordance with the various aspects disclosed herein. The packaged devices may then be employed in the various devices described herein.

In accordance with the various aspects disclosed herein, at least one example aspect includes a device including bump pad structures (e.g., 100, 300, 400, 500 and 600) alone or integrated into another apparatus, the device including a bump pad (e.g., 110, 310, 410, 510 and 610). The device also includes a first trace (e.g., 120, 320, 420, 520 and 620) adjacent the bump pad. A first trace top surface (e.g., 323) is recessed a first recess distance (e.g., 119, 319, 419, 519 and 619) from a bump pad top surface (e.g., 313). The device also includes a second trace adjacent the first trace (e.g., 130, 330, 430, 530 and 630), covered at least in part by a solder resist (e.g., 140, 340, 440, 540 and 640). The device also includes a substrate (e.g., 160, 360, 460, 560 and 660), where the bump pad, the first trace, and the second trace are each formed on a portion of the substrate. In some of the foregoing examples (e.g., 100 and 300), the bump pad, the first trace, and the second trace are each embedded in the substrate. In other examples (e.g., 400, 500 and 600) the bump pad, the first trace, and the second trace are each formed on top of the substrate. Accordingly, it will be appreciated that the various aspects disclosed can include any substrate configuration including one or more insulating and conductive layers and may be used in applications such as package substrates, printed circuit boards (PCBs) including various fabrication technologies, such as embedded-trace-substrate (ETS), semi-additive process (SAP), and modified semi-additive process (mSAP) examples discussed herein. However, it will be appreciated that the various examples provided herein are solely provided to aid in discussion of the various aspects disclosed and are not intended to limit claimed combinations.

In additional aspects, the device may include: a plurality of bump pads formed in a bumping region of the substrate (e.g., 210); a plurality of first traces formed in an open region (e.g., 220) of the substrate; and a plurality of second traces covered at least in part by a solder resist formed in a solder resist region (e.g., 230) of the substrate. The open region is located on both sides of the bumping region, and where the solder resist region is located on each side of the open region opposite the bumping region. Additionally, as discussed in the foregoing, the top surface of the bump pad and the top surface of the first trace have less surface roughness than the top surface of the second trace. For example, the top surface of the bump pad and the top surface of the first trace each have a maximum roughness average of 200 nm and the top surface of the second trace may have a maximum roughness average of 550 nm.

It will be appreciated from the disclosure herein that the various technical advantages are provided by the various aspects disclosed. In at least some aspects, the thickness difference (e.g., first recess distance) between the bump pad and the first trace provides for better attachment of the pillar or other connection to bump pad. Additionally, reducing the surface roughness on the bump pad reduces the NCP filler entrapment risk and promotes better solder joints. Additionally, bump wettability is improved which results in better yield for a given design.

Other technical advantages will be recognized from various aspects disclosed herein and these technical advantages are merely provided as examples and should not be construed to limit any of the various aspects disclosed herein.

Figure 9:
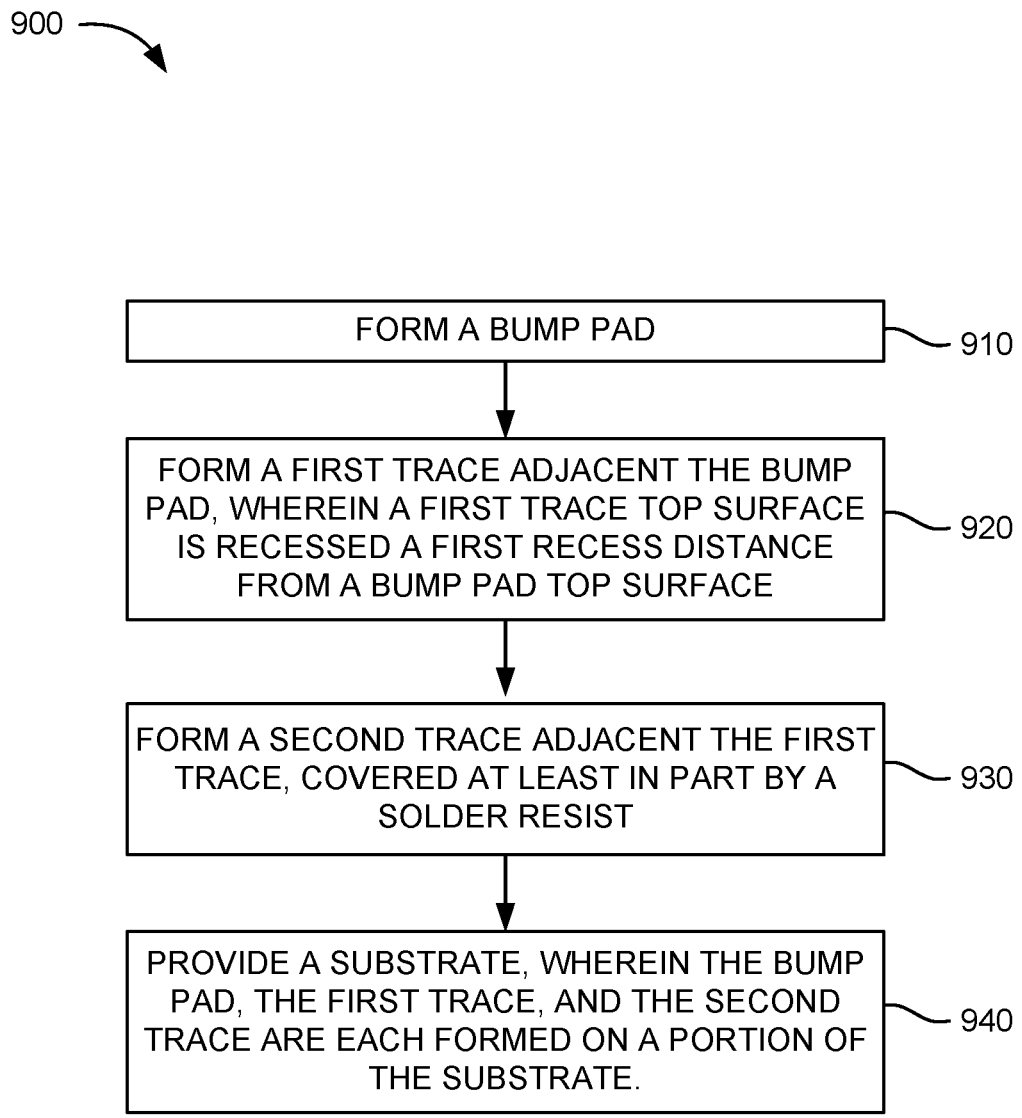
FIG. 9 illustrates a flowchart of a method for manufacturing a bump pad structure in accordance with at least one aspect of the disclosure.

It will be appreciated from the foregoing that there are various methods for fabricating devices including the bump pad structures disclosed herein. FIG. 9 illustrates a flowchart of an example method 900 for fabricating device including a bump pad structure in accordance with at least one aspect disclosed. In block 910, the fabrication process can include forming a bump pad. In block 920, the fabrication process can also include forming a first trace adjacent the bump pad, where a first trace top surface is recessed a first recess distance from a bump pad top surface. In block 930, the fabrication process can also include forming a second trace adjacent the first trace, covered at least in part by a solder resist. In block 940, the fabrication process can also include providing a substrate, where the bump pad, the first trace, and the second trace are each formed on a portion of the substrate.

It will be appreciated from the foregoing disclosure that additional processes for fabricating the various aspects disclosed herein will be apparent to those skilled in the art and a literal rendition of the processes discussed above will not be provided or illustrated in the included drawings.

It will be appreciated that various aspects disclosed herein can be described as functional equivalents to the structures, materials and/or devices described and/or recognized by those skilled in the art. For example, in one aspect, an apparatus may comprise a means for performing the various functionalities discussed above. It will be appreciated that the aforementioned aspects are merely provided as examples and the various aspects claimed are not limited to the specific references and/or illustrations cited as examples.

One or more of the components, processes, features, and/or functions illustrated in FIGS. 1-9 may be rearranged and/or combined into a single component, process, feature or function or incorporated in several components, processes, or functions. Additional elements, components, processes, and/or functions may also be added without departing from the disclosure. It should also be noted that FIGS. 1-9 and corresponding description in the present disclosure are not limited to dies and/or integrated circuits (ICs). In some implementations, FIGS. 1-9 and its corresponding description may be used to manufacture, create, provide, and/or produce integrated devices. In some implementations, a device may include a die, an integrated device, a die package, an integrated circuit (IC), a device package, an IC package, a wafer, a semiconductor device, a package on package (PoP) device, and/or an interposer.

As used herein, the terms "user equipment" (or "UE"), "user device," "user terminal," "client device," "communication device," "wireless device," "wireless communications device," "handheld device," "mobile device," "mobile terminal," "mobile station," "handset," "access terminal," "subscriber device," "subscriber terminal," "subscriber station," "terminal," and variants thereof may interchangeably refer to any suitable mobile or stationary device that can receive wireless communication and/or navigation signals. These terms include, but are not limited to, a music player, a video player, an entertainment unit, a navigation device, a communications device, a smartphone, a personal digital assistant, a fixed location terminal, a tablet computer, a computer, a wearable device, a laptop computer, a server, an automotive device in an automotive vehicle, and/or other types of portable electronic devices typically carried by a person and/or having communication capabilities (e.g., wireless, cellular, infrared, short-range radio, and the like). These terms are also intended to include devices which communicate with another device that can receive wireless communication and/or navigation signals such as by short-range wireless, infrared, wireline connection, or other connection, regardless of whether satellite signal reception, assistance data reception, and/or position-related processing occurs at the device or at the other device. In addition, these terms are intended to include all devices, including wireless and wireline communication devices, that are able to communicate with a core network via a radio access network (RAN), and through the core network the UEs can be connected with external networks such as the Internet and with other UEs.

The wireless communication between electronic devices can be based on different technologies, such as code division multiple access (CDMA), wideband CDMA, time division multiple access (TDMA), frequency division multiple access (FDMA), Orthogonal Frequency Division Multiplexing (OFDM), Global System for Mobile Communications (GSM), 3GPP Long Term Evolution (LTE), 5G New Radio, Bluetooth (BT), Bluetooth Low Energy (BLE), Institute of Electrical and Electronics Engineers (IEEE) 802.11 (WiFi), and IEEE 802.15.4 (Zigbee/Thread) or other protocols that may be used in a wireless communications network or a data communications network. Bluetooth Low Energy (also known as Bluetooth LE, BLE, and Bluetooth Smart) is a wireless personal area network technology designed and marketed by the Bluetooth Special Interest Group intended to provide considerably reduced power consumption and cost while maintaining a similar communication range. BLE was merged into the main Bluetooth standard in 2010 with the adoption of the Bluetooth Core Specification Version 4.0 and updated in Bluetooth 5.

It should be noted that the terms "connected", "coupled", or any variant thereof, mean any connection or coupling, either direct or indirect, between elements, and can encompass a presence of an intermediate element between two elements that are "connected" or "coupled" together via the intermediate element unless the connection is expressly disclosed as being directly connected.

Any reference herein to an element using a designation such as "first," "second," and so forth does not limit the quantity and/or order of those elements. Rather, these designations are used as a convenient method of distinguishing between two or more elements and/or instances of an element. Also, unless stated otherwise, a set of elements can comprise one or more elements.

Those skilled in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Nothing stated or illustrated depicted in this application is intended to dedicate any component, action, feature, benefit, advantage, or equivalent to the public, regardless of whether the component, action, feature, benefit, advantage, or the equivalent is recited in the claims.

Further, those of skill in the art will appreciate that the various illustrative logical blocks, modules, circuits, and algorithm actions described in connection with the examples disclosed herein may be implemented as electronic hardware, computer software, or combinations of both. To clearly illustrate this interchangeability of hardware and software, various illustrative components, blocks, modules, circuits, and actions have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

Although some aspects have been described in connection with a device, it goes without saying that these aspects also constitute a description of the corresponding method, and so a block or a component of a device should also be understood as a corresponding method action or as a feature of a method action. Analogously thereto, aspects described in connection with or as a method action also constitute a description of a corresponding block or detail or feature of a corresponding device.

In the detailed description above it can be seen that different features are grouped together in examples. This manner of disclosure should not be understood as an intention that the claimed examples have more features than are explicitly mentioned in each claim. Rather, the various aspects of the disclosure may include fewer than all features of an individual example disclosed. Therefore, the following claims should hereby be deemed to be incorporated in the description, wherein each claim by itself can stand as a separate example. Although each claim by itself can stand as a separate example, it should be noted that each claim is not an exclusive example. For example, a dependent claim can depend from a specific claim or combination claims. However, other examples can also encompass or include a combination of the dependent claim features with the features of any other dependent claim or a combination of any features with other dependent claims. Such combinations are proposed herein, unless it is explicitly expressed or can be readily inferred that a specific combination is not intended (e.g., contradictory aspects, such as defining a claimed feature as both an insulator and a conductor). Furthermore, it is also intended that features of a claim can be included in any other independent claim, even if the claim is not directly dependent on the independent claim.

Further aspects may include one or more of the following aspects discussed in the various examples. A further example implementation may include the device further including a plurality of bump pads formed in a bumping region of the substrate. Another example implementation, which may be combined with any of the foregoing examples, includes the device further including a plurality of first traces formed in an open region of the substrate and a plurality of second traces covered at least in part by a solder resist formed in a solder resist region of the substrate, where the open region is located on both sides of the bumping region and where the solder resist region is located on each side of the open region opposite the bumping region. Another example implementation, which may be combined with any of the foregoing examples, includes the device where the bump pad, the first trace, and the second trace are each embedded in the substrate. Another example implementation, which may be combined with any of the foregoing examples, includes the device where the bump pad is recessed from a top surface of the substrate by a pad recess depth. Another example implementation, which may be combined with any of the foregoing examples, includes the device further including where the pad recess depth is in a range of 1 um to 3 um. Another example implementation, which may be combined with any of the foregoing examples, includes the device where the first trace is recessed from the top surface of the substrate by a first trace recess depth. Another example implementation, which may be combined with any of the foregoing examples, includes the device where the first trace recess depth is in a range of 3 um to 7 um. Another example implementation, which may be combined with any of the foregoing examples, includes the device where the first recess distance is a difference between the first trace recess depth and the pad recess depth. Another example implementation, which may be combined with any of the foregoing examples, includes the device where a top surface of the bump pad and a top surface of the first trace have less surface roughness than a top surface of the second trace. Another example implementation, which may be combined with any of the foregoing examples, includes the device where the top surface of the bump pad and the top surface of the first trace each have a maximum roughness average of 200 nm and the top surface of the second trace has a maximum roughness average of 550 nm. Another example implementation, which may be combined with any of the foregoing examples, includes the device where the bump pad, the first trace, and the second trace are each formed on a top surface of the substrate. Another example implementation, which may be combined with any of the foregoing examples, includes the device where the bump pad has a pad thickness measured from a top surface of the substrate. Another example implementation, which may be combined with any of the foregoing examples, includes the device where the pad thickness is in a range of 9 um to 12 um. Another example implementation, which may be combined with any of the foregoing examples, includes the device where the first trace has a first thickness measured from the top surface of the substrate. Another example implementation, which may be combined with any of the foregoing examples, includes the device where the first thickness is in a range of 6 um to 9 um. Another example implementation, which may be combined with any of the foregoing examples, includes the device where the first recess distance is a difference between the pad thickness and the first thickness. Another example implementation, which may be combined with any of the foregoing examples, includes the device further including a seed layer disposed on the substrate, where the seed layer forms part of the bump pad, the first trace and the second trace. Another example implementation, which may be combined with any of the foregoing examples, includes the device further including a base metal layer disposed on the substrate, where the seed layer is deposited on the base metal layer. Another example implementation, which may be combined with any of the foregoing examples, includes the device further including a primer layer disposed on the substrate, where the seed layer is deposited on the primer layer. Another example implementation, which may be combined with any of the foregoing examples, includes the device where the device is incorporated into an apparatus selected from the group including of a music player, a video player, an entertainment unit, a navigation device, a communications device, a mobile device, a mobile phone, a smartphone, a personal digital assistant, a fixed location terminal, a tablet computer, a computer, a wearable device, an Internet of things (IoT) device, a laptop computer, a server, and a device in an automotive vehicle.

Further aspects may include one or more of the following features discussed in the various example aspects. Another example method, which may be combined with any of the foregoing examples, includes the method further including: forming a plurality of bump pads in a bumping region of the substrate; forming a plurality of first traces in an open region of the substrate; and forming a plurality of second traces covered at least in part by a solder resist in a solder resist region of the substrate, where the open region is located on both sides of the bumping region, and where the solder resist region is located on each side of the open region opposite the bumping region. Another example method, which may be combined with any of the foregoing examples, includes the method where forming the bump pad, the first trace and the second trace include: forming a mask over the bump pad; and performing a first etching process, where the first etching process reduces a thickness of the first trace and a thickness of the second trace. Another example method, which may be combined with any of the foregoing examples, includes the method where forming the bump pad, the first trace and the second trace further includes: stripping the mask from the bump pad; performing a roughing process to roughen exposed surfaces of the bump pad, the first trace and the second trace; and depositing the solder resist to the second trace. Another example method, which may be combined with any of the foregoing examples, includes the method where forming the bump pad, the first trace and the second trace further includes: performing a second etching process, where the second etching process reduces the thickness of the first trace and a thickness of the bump pad to form the first recess distance. Another example method, which may be combined with any of the foregoing examples, includes the method where a top surface of the bump pad and a top surface of the first trace have less surface roughness than a top surface of the second trace due to the second etching process. Another example method, which may be combined with any of the foregoing examples, includes the method where the top surface of the bump pad and the top surface of the first trace each have a maximum roughness average of 200 nm and the top surface of the second trace has a maximum roughness average of 550 nm. Another example method, which may be combined with any of the foregoing examples, includes the method where the bump pad, the first trace, and the second trace are each embedded in the substrate. Another example method, which may be combined with any of the foregoing examples, includes the method where the bump pad, the first trace, and the second trace are each formed on a top surface of the substrate. Another example method, which may be combined with any of the foregoing examples, includes the method where the device is incorporated into an apparatus selected from the group including of a music player, a video player, an entertainment unit, a navigation device, a communications device, a mobile device, a mobile phone, a smartphone, a personal digital assistant, a fixed location terminal, a tablet computer, a computer, a wearable device, an Internet of things (IoT) device, a laptop computer, a server, and a device in an automotive vehicle.

It should furthermore be noted that methods, systems, and apparatus disclosed in the description or in the claims can be implemented by a device comprising means for performing the respective actions and/or functionalities of the methods disclosed.

Furthermore, in some examples, an individual action can be subdivided into a plurality of sub-actions or contain a plurality of sub-actions. Such sub-actions can be contained in the disclosure of the individual action and be part of the disclosure of the individual action.

While the foregoing disclosure shows illustrative examples of the disclosure, it should be noted that various changes and modifications could be made herein without departing from the scope of the disclosure as defined by the appended claims. The functions and/or actions of the method claims in accordance with the examples of the disclosure described herein need not be performed in any particular order. Additionally, well-known elements will not be described in detail or may be omitted so as to not obscure the relevant details of the aspects and examples disclosed herein. Furthermore, although elements of the disclosure may be described or claimed in the singular, the plural is contemplated unless limitation to the singular is explicitly stated.

What is claimed is:

1. A device, comprising:
 a bump pad;
 a first trace adjacent the bump pad, wherein a first trace top surface is recessed a first recess distance from a bump pad top surface;
 a second trace adjacent the first trace, covered at least in part by a solder resist, wherein the first trace is disposed between the bump pad and the second trace; and
 a substrate, wherein the bump pad, the first trace, and the second trace are each formed on a portion of the substrate, wherein the bump pad, the first trace, and the second trace are each embedded in the substrate.

2. The device of claim 1, further comprising:
 a plurality of bump pads formed in a bumping region of the substrate;
 a plurality of first traces formed in an open region of the substrate; and
 a plurality of second traces covered at least in part by a solder resist formed in a solder resist region of the substrate,
 wherein the open region is located on both sides of the bumping region, and wherein the solder resist region is located on each side of the open region opposite the bumping region.

3. The device of claim 1, wherein the bump pad is recessed from a top surface of the substrate by a first depth.

4. The device of claim 3, wherein the first depth is in a range of 1 um to 3 um.

5. The device of claim 3, wherein the first trace is recessed from the top surface of the substrate by a second depth.

6. The device of claim 5, wherein the second depth is in a range of 3 um to 7 um.

7. The device of claim 6, wherein the first recess distance is a difference between the second depth and the first depth.

8. The device of claim 1, wherein a top surface of the bump pad and a top surface of the first trace have less surface roughness than a top surface of the second trace.

9. The device of claim 8, wherein the top surface of the bump pad and the top surface of the first trace each have a maximum roughness average of 200 nm and the top surface of the second trace has a maximum roughness average of 550 nm.

10. A device, comprising:
 a bump pad;
 a first trace adjacent the bump pad, wherein a first trace top surface is recessed a first recess distance from a bump pad top surface;
 a second trace adjacent the first trace, covered at least in part by a solder resist, wherein the first trace is disposed between the bump pad and the second trace; and
 a substrate, wherein the bump pad, the first trace, and the second trace are each formed on a portion of the substrate, wherein the bump pad, the first trace, and the second trace are each formed on a top surface of the substrate.

11. The device of claim 10, wherein the bump pad has a pad thickness measured from a top surface of the substrate.

12. The device of claim 11, wherein the pad thickness is in a range of 9 um to 12 um.

13. The device of claim 11, wherein the first trace has a first thickness measured from the top surface of the substrate.

14. The device of claim 13, wherein the first thickness is in a range of 6 um to 9 um.

15. The device of claim 13, wherein the first recess distance is a difference between the pad thickness and the first thickness.

16. The device of claim 10, further comprising:
 a seed layer disposed on the substrate, wherein the seed layer forms part of the bump pad, the first trace and the second trace.

17. The device of claim 16, further comprising:
 a base metal layer disposed on the substrate, wherein the seed layer is deposited on the base metal layer.

18. The device of claim 16, further comprising:
 a primer layer disposed on the substrate, wherein the seed layer is deposited on the primer layer.

19. The device of claim 1, wherein the device is a music player, a video player, an entertainment unit, a navigation device, a communications device, a mobile device, a mobile phone, a smartphone, a personal digital assistant, a fixed location terminal, a tablet computer, a computer, a wearable device, an Internet of things (IoT) device, a laptop computer, a server, or an automotive vehicle.

20. A method of fabricating a device, comprising:
 forming a bump pad;
 forming a first trace adjacent the bump pad, wherein a first trace top surface is recessed a first recess distance from a bump pad top surface;
 forming a second trace adjacent the first trace, covered at least in part by a solder resist, wherein the first trace is disposed between the bump pad and the second trace; and
 providing a substrate, wherein the bump pad, the first trace, and the second trace are each formed on a portion of the substrate,
 wherein forming the bump pad, the first trace and the second trace comprise:
 forming a mask over the bump pad; and
 performing a first etching process, wherein the first etching process reduces a thickness of the first trace and a thickness of the second trace.

21. The method of claim 20, further comprising:
 forming a plurality of bump pads in a bumping region of the substrate;
 forming a plurality of first traces in an open region of the substrate; and
 forming a plurality of second traces covered at least in part by a solder resist in a solder resist region of the substrate,
 wherein the open region is located on both sides of the bumping region, and wherein the solder resist region is located on each side of the open region opposite the bumping region.

22. The method of claim 20, wherein forming the bump pad, the first trace and the second trace further comprises:
   stripping the mask from the bump pad;
   performing a roughing process to roughen exposed surfaces of the bump pad, the first trace and the second trace; and
   depositing the solder resist to the second trace.

23. The method of claim 20, wherein forming the bump pad, the first trace and the second trace further comprises:
   performing a second etching process, wherein the second etching process reduces the thickness of the first trace and a thickness of the bump pad to form the first recess distance.

24. The method of claim 23, wherein a top surface of the bump pad and a top surface of the first trace have less surface roughness than a top surface of the second trace due to the second etching process.

25. The method of claim 24, wherein the top surface of the bump pad and the top surface of the first trace each have a maximum roughness average of 200 nm and the top surface of the second trace has a maximum roughness average of 550 nm.

26. The method of claim 20, wherein the bump pad, the first trace, and the second trace are each embedded in the substrate.

27. The method of claim 20, wherein the bump pad, the first trace, and the second trace are each formed on a top surface of the substrate.

28. A device, comprising:
   a bump pad;
   a first trace adjacent the bump pad, wherein a first trace top surface is recessed a first recess distance from a bump pad top surface;
   a second trace adjacent the first trace, covered at least in part by a solder resist; and
   a substrate, wherein the bump pad, the first trace, and the second trace are each formed on a portion of the substrate and wherein a top surface of the bump pad and a top surface of the first trace have less surface roughness than a top surface of the second trace.

* * * * *